United States Patent
Wang et al.

(10) Patent No.: US 8,929,158 B1
(45) Date of Patent: Jan. 6, 2015

(54) AUTO-TRIMMING OF INTERNALLY GENERATED VOLTAGE LEVEL IN AN INTEGRATED CIRCUIT

(71) Applicant: Integrated Silicon Solution, Inc., Milpitas, CA (US)

(72) Inventors: MingShiang Wang, Cupertino, CA (US); Kyoung Chon Jin, San Ramon, CA (US)

(73) Assignee: Integrated Silicon Solution, Inc., Milpitas, CA (US)

(*) Notice: Subject to any disclaimer, the term of this patent is extended or adjusted under 35 U.S.C. 154(b) by 0 days.

(21) Appl. No.: 14/054,598

(22) Filed: Oct. 15, 2013

(51) Int. Cl.
| | | |
|---|---|---|
| G11C 16/30 | (2006.01) | |
| G11C 7/14 | (2006.01) | |
| G11C 16/34 | (2006.01) | |
| G11C 29/00 | (2006.01) | |
| G11C 29/08 | (2006.01) | |
| G11C 5/14 | (2006.01) | |
| G11C 29/02 | (2006.01) | |
| G11C 29/50 | (2006.01) | |

(52) U.S. Cl.
CPC ...... *G11C 5/147* (2013.01); *G11C 7/14* (2013.01); *G11C 29/028* (2013.01); *G11C 29/50004* (2013.01)
USPC ............ 365/189.09; 365/185.24; 365/189.07; 365/189.05; 365/201

(58) Field of Classification Search
CPC .... G11C 7/14; G11C 5/147; G11C 29/50004; G11C 29/028
USPC ............... 365/189.08, 185.2, 185.24, 189.07, 365/201, 189.05
See application file for complete search history.

(56) References Cited

U.S. PATENT DOCUMENTS

| | | |
|---|---|---|
| 5,822,250 A | 10/1998 | Krzentz |
| 6,720,800 B2 | 4/2004 | Shyr et al. |
| 6,826,103 B2 | 11/2004 | Moon et al. |
| 7,359,255 B2 | 4/2008 | Kimura et al. |
| 7,433,790 B2 | 10/2008 | Anderson et al. |
| 7,853,845 B2 | 12/2010 | Dixon |
| 2006/0273846 A1 | 12/2006 | Lee |

*Primary Examiner* — Ly D Pham
(74) *Attorney, Agent, or Firm* — Van Pelt, Yi & James LLP

(57) ABSTRACT

A method to trim a reference voltage source formed on an integrated circuit includes configuring the integrated circuit in a test mode; providing a power supply voltage and a trim code sequence to the integrated circuit where the power supply voltage is provided by a precision reference voltage source; generating a target voltage on the integrated circuit using the power supply voltage; generate a reference voltage using the reference voltage source formed on the integrated circuit; applying one or more trim codes in the trim code sequence to the reference voltage source to adjust the reference voltage; comparing the reference voltage generated based on the trim codes to the target voltage; asserting a latch signal in response to a determination that the reference voltage generated based on a first trim code is equal to the target voltage; and storing the first trim code in response to the latch signal being asserted.

10 Claims, 4 Drawing Sheets

AUTO-TRIMMING OF INTERNALLY GENERATED VOLTAGE LEVEL IN AN INTEGRATED CIRCUIT

BACKGROUND OF THE INVENTION

CMOS integrated circuits, such as memory or mixed signal circuits, typically require a specified and stable reference voltage to insure proper circuit operation. In the design of integrated circuits, a reference voltage is typically generated internally on the integrated circuit, or "on-chip," for use by circuitry on the integrated circuit. The internally generated reference voltage needs to be stable and accurate to be useful. Due to fabrication process variations, the voltage value generated by an internal or on-chip reference voltage source often varies from chip to chip. To set the desired operating point for the internal reference voltage source, adjustments to the integrated circuit is performed to fine tune the internal reference voltage source to the desired operating point. The adjustment process is referred to as trimming and the adjustments are typically made through trim bits that are stored on the integrated circuit to set the desired operating point of the internal reference voltage source.

Conventional trimming methods involve testing the integrated circuit on a tester to find the set of trim bits that gives the desired reference voltage value. FIG. 1 is a schematic diagram illustrating a conventional trimming method applied to an integrated circuit. Referring to FIG. 1, an integrated circuit 1 is a memory integrated circuit and includes memory circuitry 2 for its native function. The memory circuitry 2 uses a reference voltage Vrefi (node 6) for some of its operations. An internal or on-chip reference voltage source 4 generates the reference voltage Vrefi for the memory circuitry 2. The internal reference voltage source 4 typically receives the power supply voltage Vdd to generate the reference voltage Vrefi. The reference voltage Vrefi generated by the reference voltage source 4 may vary from chip to chip due to process variations. Because accuracy of the reference voltage Vrefi is important to the operation of the memory circuitry 2, the integrated circuit 1 provides circuitry to trim the reference voltage source 4 to the desired reference voltage level. In particular, the reference voltage source 4 is configured to receive a set of trim bits 12 which is used to trim or adjust the voltage value generated by the reference voltage source.

The conventional trimming method for the internal reference voltage source 4 is performed as follows. The integrated circuit is placed on the tester and put in a test mode. A test program is designed to supply a trim code sequence to the integrated circuit. The tester applies the trim code sequence to the trim bits 12 of the integrated circuit. Meanwhile, the reference voltage Vrefi generated by the internal reference voltage source 4 is coupled to a voltage measurement port on the tester, such as through an input/output pin of the integrated circuit 1, to be measured. With each trim code being applied, the reference voltage source 4 generates a different reference voltage value. The tester compares the reference voltage generated from the reference voltage source 4 to a target voltage at the tester's voltage measurement port. When the target voltage level is detected, the tester writes or programs the trim code corresponding to the target voltage level to the integrated circuit. More specifically, the trim code is stored in a non-volatile memory 8 of the integrated circuit for use in the normal operation of the integrated circuit. When the integrated circuit 1 is applied in its normal operation, the internal reference voltage source generates a reference voltage having the desired target voltage value based on the stored trim code. However, the conventional trimming methods can be time consuming because the reference voltage generated by the internal reference voltage source must be measured by the voltage measurement units on the tester. The tester voltage measurement units often have a long settling time so that voltage measurements at the tester can take a long time.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, a method for trimming an on-chip reference voltage source of an integrated circuit uses an on-chip trim circuit to compare the reference voltage generated by the on-chip reference voltage source against a target voltage, also generated on-chip. The on-chip trimming circuit latches the trim code when the reference voltage reaches the desired target voltage level. By performing the voltage comparison on-chip rather than at the tester, the trimming process for the integrated circuit can be faster and less tester resource is needed for the trimming process.

Figure 1:
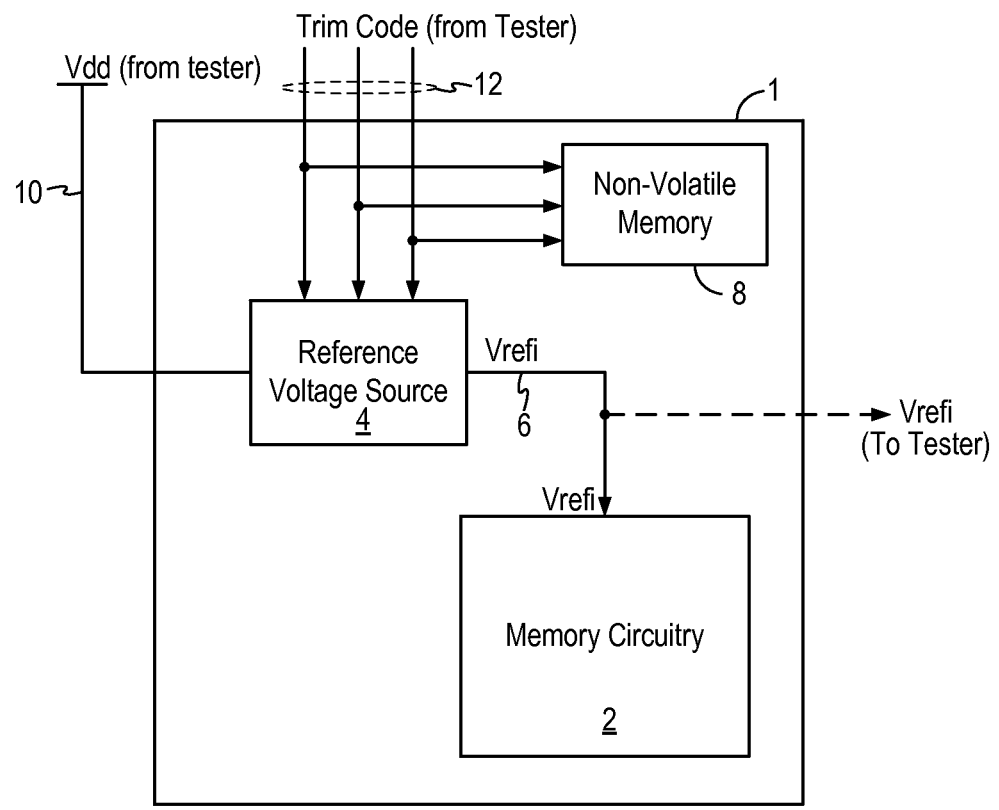
FIG. 1 is a schematic diagram illustrating a conventional trimming method applied to an integrated circuit.
Figure 2:
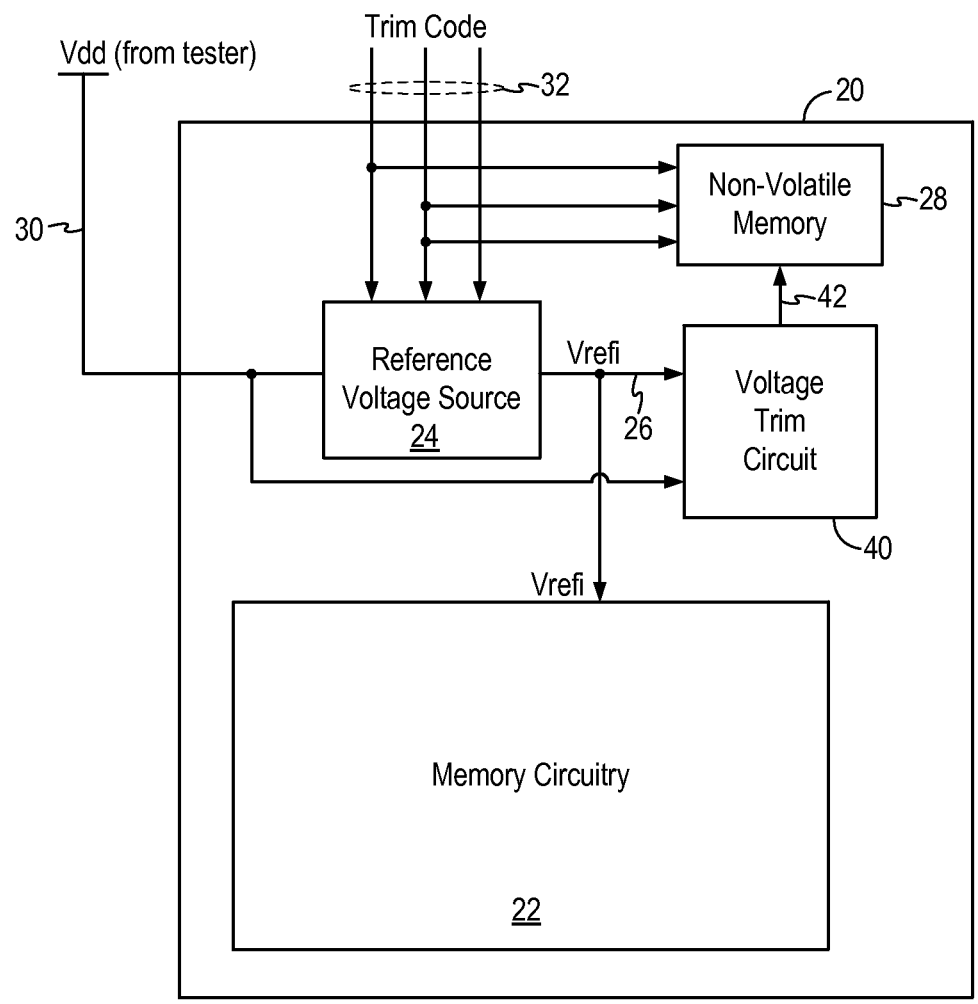
FIG. 2 is a schematic diagram illustrating an integrated circuit incorporating an on-chip trim circuit in embodiments of the present invention.

FIG. 2 is a schematic diagram illustrating an integrated circuit incorporating an on-chip trim circuit in embodiments of the present invention. In the present embodiment, the on-chip trim circuit is configured to trim a voltage value and is also referred to as a "voltage trim circuit" in the follow description. Referring to FIG. 2, an integrated circuit 20 is a memory integrated circuit in the present embodiment and includes memory circuitry 22 for its native function. The memory circuitry 22 uses a reference voltage Vrefi (node 26) for some of its operations. The integrated circuit 20 includes an internal or on-chip reference voltage source 24 which is powered by a power supply voltage Vdd (node 30) of the integrated circuit and generates the reference voltage Vrefi for the memory circuitry 22. The reference voltage Vrefi generated by the reference voltage source 24 may vary from chip to chip due to process variations. Therefore, after the integrated circuit 20 is manufactured, the reference voltage source 24 is trimmed, typically during final testing of the integrated circuit, to ensure that the integrated circuit generates a reference voltage having the desired accurate voltage level. In the present description, trimming of the reference voltage source 24 refers to adjusting the reference voltage generated by the reference voltage source based on the value of one or more trim bits 32. A trim code applied to the trim bits that gives the desired accurate voltage level for the reference voltage is stored in a non-volatile memory 28 of the integrated circuit.

In embodiments of the present invention, the integrated circuit 20 includes an on-chip voltage trim circuit 40 to perform trimming of the reference voltage source 24. The on-chip voltage trim circuit 40 is used during the trimming process when the integrated circuit is placed in a test mode to performing trimming of the reference voltage source 24. The voltage trim circuit 40 receives the power supply voltage Vdd (node 30) and the reference voltage Vrefi generated by the reference voltage source 24. The voltage trim circuit 40 generates an on-chip target voltage used to compare with the reference voltage Vrefi. The voltage trim circuit 40 generates a latch signal to the non-volatile memory 28 to store the trim code when the reference voltage Vrefi is at the target voltage level. The trim operation using the on-chip voltage trim circuit 40 will be described in more details below.

Figure 3:
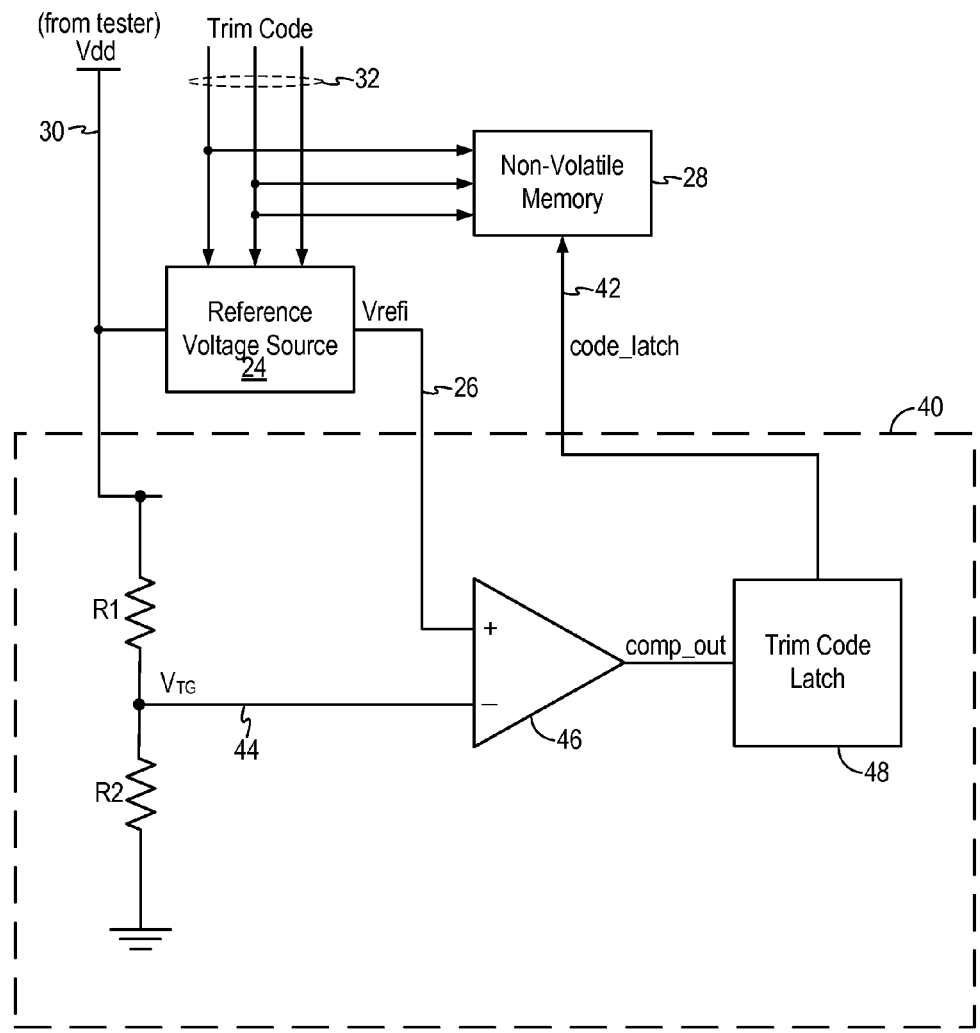
FIG. 3 is a circuit diagram illustrating the implementation of an on-chip voltage trim circuit in one embodiment of the present invention.

FIG. 3 is a circuit diagram illustrating the implementation of an on-chip voltage trim circuit in one embodiment of the present invention. Referring to FIG. 3, the voltage trim circuit 40 includes a resistor voltage divider including resistors R1 and R2. The resistor voltage divider is coupled to receive the power supply voltage Vdd (node 30) and generates a target voltage $V_{TG}$ (node 44) being the desired voltage value for the reference voltage Vrefi of the on-chip reference voltage source 24. The voltage trim circuit 40 further includes a comparator 46 configured to compare the reference voltage Vrefi to the target voltage $V_{TG}$. During the trim operation, a sequence of trim codes is provided to the trim bits of the reference voltage source 24. For instance, the trim code sequence can be provided by a tester. Alternately, the trim code sequence can be generated internally on the integrated circuit 20, such as by an on-chip code generator. Each trim code will adjust the voltage value of the reference voltage generated by the reference voltage source 24. The reference voltage generated based on each trim code is compared with the target voltage $V_{TG}$. When comparator 46 detects that the reference voltage matches the target voltage $V_{TG}$, the comparator 46 asserts it output signal comp_out. The comparator output signal comp_out is provided to a trim code latch 48. The trim code latch circuit 48 examines the states of the comparator output signal comp_out for each trim code of the trim code sequence. The trim code latch circuit 48 determines which trim code should be latched and generates a code_latch signal (node 42) to instruct non-volatile memory 28 to store the trim code presently provided to the trim bits 32 which corresponds to the desired reference voltage Vrefi being generated. When the integrated circuit 20 is applied in its normal operation, the internal reference voltage source 24 generates the reference voltage Vrefi having the desired target voltage value based on the stored trim code. In some embodiments, the trim code latch circuit 48 selects the first assertion of the comparator output signal to latch the trim code. In other embodiments, the trim code latch circuit 48 selects a second or third assertion of the comparator output signal to latch the trim code.

A salient feature of the on-chip voltage trim circuit of the present invention is that the target voltage is generated on-chip and the voltage comparison is performed on-chip, instead of at the tester. In particular, the integrated circuit 20 is placed on the tester and put in the test mode for performing the trim operation. During the trim operation, the integrated circuit 20 receives the power supply voltage Vdd from the tester. Because the power supply voltage Vdd is supplied by the tester, the Vdd voltage is very accurate. The voltage trim circuit 40 generates the target voltage from the tester-supplied Vdd voltage using a resistor voltage divider. Thus, the on-chip voltage trim circuit 40 generates a highly accurate target voltage $V_{TG}$ on-chip for use in comparison with the reference voltage Vrefi. With the target voltage $V_{TG}$ thus generated on-chip, the voltage comparison is also performed on-chip which is faster than reading out the reference voltage value and then performing the voltage comparison off-chip using a voltmeter of the tester. The voltage measurement unit or the voltmeter of the tester typically has a long settling time. Accordingly, the trim method of the present invention using the on-chip voltage trim circuit can be carried out much faster and using fewer tester resources. The tester only needs to provide the power supply voltage Vdd. In some cases, the tester also provides the trim code sequence. The rest of the trim operation is performed on-chip by the voltage trim circuit 40 and a trim code that generates the desired target value for the reference voltage is latched on-chip by the voltage trim circuit. In some examples, the trim operation using the on-chip trim circuit of the present invention can be completed in micro-seconds range.

In the above-described embodiment, a resistor voltage divider is used to divide down the tester-supplied power supply voltage to generate the target voltage $V_{TG}$. In other embodiments, other voltage divider circuits can be used, such as a capacitor divider circuit. The use of a resistor voltage divider is illustrative only and not intended to be limiting.

Furthermore, in the above-described embodiment, the trim circuit receives a tester-supplied power supply voltage Vdd during the trim process. In other embodiments, the power supply voltage Vdd can be generated by a precision reference voltage source external to the integrated circuit. The use of a tester-supplied power supply voltage Vdd is illustrative only and not intended to be limiting.

Figure 4:
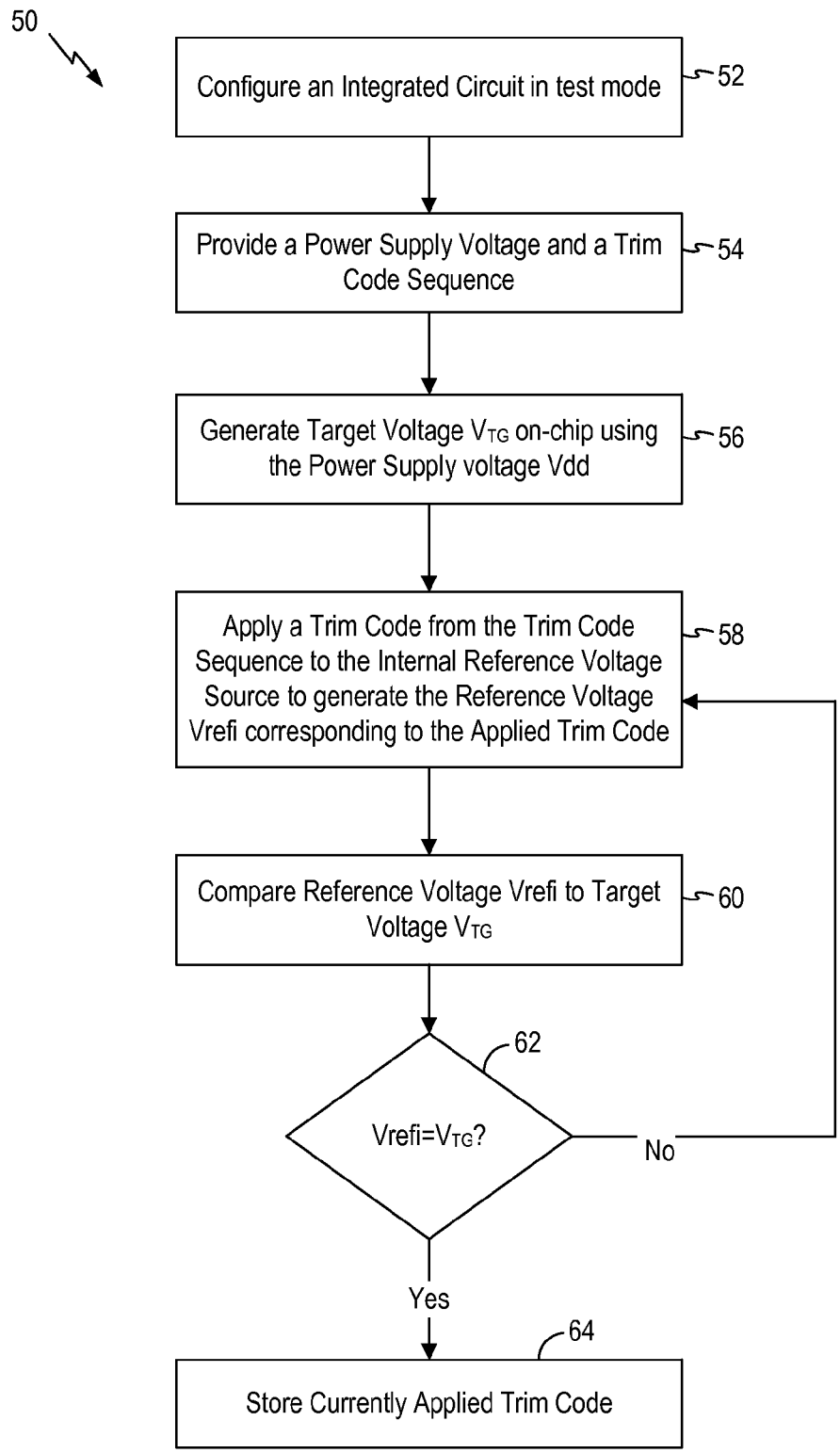
FIG. 4 is a flow chart illustrating the trim method using an on-chip trim circuit in embodiments of the present invention.

FIG. 4 is a flow chart illustrating a method for trimming an on-chip reference voltage source of an integrated circuit using an on-chip trim circuit in embodiments of the present invention. The trim method of FIG. 4 will be described with reference to the integrated circuit and on-chip trim circuit of FIGS. 2 and 3. Referring to FIG. 4, the method 50 starts by configuring the integrated circuit 20 to operate in a test mode (52). The method 50 then provides a power supply voltage Vdd and a trim code sequence to the integrated circuit 20 (54). The power supply voltage Vdd is provided by an accurate or precision reference voltage source external to the integrated circuit. In some embodiments, the power supply voltage Vdd and the trim code sequence are provided to the integrated circuit by a tester, or an automatic test equipment (ATE) for testing semiconductor devices. In other embodiments, the trim code sequence can be generated on-chip. At 56, the method 50 generates an on-chip target voltage $V_{TG}$ on the integrated circuit using the externally supplied power supply voltage Vdd. In some embodiments, the externally supplied power supply voltage is a tester-supply voltage.

At 58, the method 50 applies a trim code from the trim code sequence to the internal reference voltage source 24 to generate a reference voltage Vrefi corresponding to the applied trim code. At 60, the method 50 compares the reference voltage Vrefi thus generated to the target voltage $V_{TG}$. At 62, the method 50 detects when the reference voltage Vrefi is equal to or nearly equal to the target voltage $V_{TG}$. In response to the reference voltage Vrefi being equal to or nearly equal to the target voltage $V_{TG}$, the method 50 stores the trim code currently applied to the internal reference voltage source 24 (64). In response to the reference voltage Vrefi not being equal to or nearly equal to the target voltage $V_{TG}$, the method 50 returns to 58 where the next trim code in the trim code sequence is applied to the internal reference voltage source 24. Subsequently, when the integrated circuit 20 is applied in its normal operation, the internal reference voltage source 24 generates the reference voltage Vrefi having the desired target voltage value based on the stored trim code.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An integrated circuit, comprising:
   a reference voltage source formed on the integrated circuit configured to receive a power supply voltage and to generate a reference voltage, the reference voltage being adjusted in accordance with on one or more trim bits provided to the reference voltage source;
   a non-volatile memory formed on the integrated circuit configured to store a trim code to be applied to the one or more trim bits; and
   a trim circuit formed on the integrated circuit configured to receive the power supply voltage and to generate a target voltage using the power supply voltage, the trim circuit further configured to compare the reference voltage to the target voltage and to generate a latch signal for the non-volatile memory,
   wherein in response to the integrated circuit being configured in a test mode, the reference voltage source and the trim circuit receives the power supply voltage provided by a precision reference voltage source external to the integrated circuit and the reference voltage source receives a trim code sequence applied to the one or more trim bits; the reference voltage source generates the reference voltage based on one or more trim codes in the trim code sequence; the trim circuit compares the target voltage to the reference voltage being generated based on the trim code sequence; the trim circuit asserts the latch signal in response to a determination that the reference voltage generated based on a first trim code is equal to the target voltage; and the non-volatile memory stores the first trim code in response to the latch signal being asserted.

2. The integrated circuit of claim 1, wherein the trim circuit comprises:
   a resistor voltage divider configured to receive the tester-supplied power supply voltage and to generate the target voltage by divided down the tester-supplied power supply voltage;
   a comparator configured to receive and compare the target voltage and the reference voltage and to generate a comparator output signal, the comparator asserting the comparator output signal in response to a determination that the reference voltage is equal to the target voltage; and
   a latch circuit configured to receive the comparator output signal and to generate the latch signal in response to the comparator output signal being asserted.

3. The integrated circuit of claim 1, wherein the power supply voltage provided by a precision reference voltage source external to the integrated circuit comprises a tester-supplied power supply voltage.

4. The integrated circuit of claim 1, wherein the trim code sequence comprises a tester-supplied trim code sequence.

5. The integrated circuit of claim 1, wherein the trim code sequence comprises a trim code sequence generated by a code generator formed on the integrated circuit.

6. A method to trim a reference voltage source formed on an integrated circuit, comprising:
   configuring the integrated circuit in a test mode;
   providing a power supply voltage and a trim code sequence to the integrated circuit, the power supply voltage being provided by a precision reference voltage source external to the integrated circuit;
   generating a target voltage on the integrated circuit using the power supply voltage;
   generating a reference voltage using the reference voltage source formed on the integrated circuit;
   applying one or more trim codes in the trim code sequence to the reference voltage source to adjust the reference voltage;
   comparing the reference voltage generated based on the one or more trim codes in the trim code sequence to the target voltage;
   asserting a latch signal in response to a determination that the reference voltage generated based on a first trim code is equal to the target voltage; and
   storing the first trim code in response to the latch signal being asserted.

7. The method of claim 6, wherein generating a target voltage on the integrated circuit using the power supply voltage comprises:
   dividing down the power supply voltage to generate the target voltage.

8. The method of claim 6, wherein providing a power supply voltage to the integrated circuit comprises providing a tester-supplied power supply voltage to the integrated circuit.

9. The method of claim 6, wherein providing a trim code sequence to the integrated circuit comprises providing a tester-supplied trim code sequence to the integrated circuit.

10. The method of claim 6, wherein providing a trim code sequence to the integrated circuit comprises generating a trim code sequence on the integrated circuit.

* * * * *